United States Patent [19]
Gahle

[11] 4,456,488
[45] Jun. 26, 1984

[54] METHOD OF FABRICATING AN INTEGRATED PLANAR TRANSISTOR

[75] Inventor: Hans-Jürgen Gahle, Emmendingen, Fed. Rep. of Germany

[73] Assignee: ITT Industries, Inc., New York, N.Y.

[21] Appl. No.: 364,157

[22] Filed: Mar. 31, 1982

[30] Foreign Application Priority Data

Apr. 14, 1981 [EP] European Pat. Off. ........ 81710017.5

[51] Int. Cl.³ .................... H01L 7/44; H01L 21/265
[52] U.S. Cl. ............................... 148/1.5; 29/576 B; 148/187; 357/34; 357/91
[58] Field of Search ............... 148/1.5, 187; 29/576 B; 357/91, 34

[56] References Cited

U.S. PATENT DOCUMENTS

| | | | |
|---|---|---|---|
| 3,756,861 | 4/1973 | Payne et al. | 148/1.5 |
| 3,928,081 | 12/1975 | Marley et al. | 148/1.5 |
| 4,018,627 | 4/1977 | Polata | 148/1.5 |
| 4,106,954 | 8/1978 | Brebisson et al. | 148/1.5 |
| 4,133,704 | 1/1979 | MacIver et al. | 148/1.5 |

OTHER PUBLICATIONS

Briska et al., IBM-TDB, 23 (1980), 644.

Primary Examiner—Upendra Roy
Attorney, Agent, or Firm—James B. Raden; Donald J. Lenkszus

[57] ABSTRACT

A method is disclosed for fabricating a monolithic integrated planar transistor whose emitter region (1) is diffused into the base region (3) on one surface side of a semiconductor wafer (2), which base region is diffused into the collector region (4). To achieve particularly small transistor structures with high cutoff frequencies, after the diffusion of the collector region (4), the impurities of the base region (3) and those of the emitter region (1) are introduced into the surface of the collector region (4) by masked ion implantation, and the implanted ions are then activated in a single tempering process, during which the base region (3) and the emitter region (1) are formed below a protective insulating layer (5) which remains on the semiconductor surface. In the protective insulating layer, windows are formed for depositing the contacts (6, 7, 8) of the collector region (4), the base region (3), and the emitter region (1).

19 Claims, 4 Drawing Figures

METHOD OF FABRICATING AN INTEGRATED PLANAR TRANSISTOR

The present invention deals with the fabrication of integrated planar transistors of very small size as are used in bipolar integrated circuits of high packing density. It starts from the triple-diffusion process (3D technology) disclosed in DE-OS No. 30 09 434 and in the journal "Electronics" of Aug. 7, 1975, pages 101 to 106. In that method, the impurities of the collector region, the base region, and the emitter region are deposited by ion implantation and diffused in three sequential steps, so that three diffusion processes succeed one another.

In addition to permitting the manufacture of bipolar integrated circuits of high packing density, this method, henceforth called "3D process", has the advantage of eliminating the need for the high-temperature processes for depositing an epitaxial layer on a substrate, which may be provided with doped regions for forming buried layers if necessary, and the diffusion of isolation regions. In the 3D process, these high-temperature processes, which are generally necessary to electrically isolate the individual transistors from each other, are replaced by one high-temperature process, namely the collector-diffusion process. Planar transistors are formed whose regions are diffused into one another.

SUMMARY OF THE INVENTION

The object of the invention is to fabricate planar transistors whose three regions are formed in only two high-temperature processes, so that very small diffusion depths are possible.

In the method according to the invention, which can thus be referred to as "2D process", besides the collector-diffusion high-temperature process, only one high-temperature process is necessary which takes place after the impurities of both the base region and the emitter region have been introduced into the semiconductor surface.

Preferably, use is made exclusively of photoresist masks to shield selected portions of the semiconductor surface during ion implantation because the production of such masks requires no high temperatures as would be necessary to produce oxide masks for the same purpose.

In a preferred embodiment of the method according to the invention, the dopant of the base region and that of the emitter region are implanted through the same oxide layer, which is produced in controlled fashion during the diffusion of the collector region. This has the advantage of compensating for the effects of variations in the thickness of the oxide layer formed during the collector diffusion on the variations in the thickness of the base region under the emitter region, because these oxide-thickness variations affect the implantation processes for introducing the dopants of both the emitter region and the base region in the same way.

If a protective oxide ($SiO_2$) is used, the high-temperature process for activating the dopants of the base region and the emitter region below the protective-oxide layer has the advantage that the $SiO_2$, which is solidified by this process, becomes etchable. This solidification goes to the point that, even if a wet-etching process is used to form contact windows, practically the same time as that required with a passivating layer thermally produced from the semiconductor material is needed for the etching process.

BRIEF DESCRIPTION OF THE DRAWING

An embodiment of the method according to the invention will now be described with reference to the accompanying drawing, in which.

DETAILED DESCRIPTION

The semiconductor wafer 2 commonly contains a plurality of integrated circuits with a plurality of integrated planar transistors. After processing, the wafer is separated into individual integrated-circuit chips.

Figure 1:
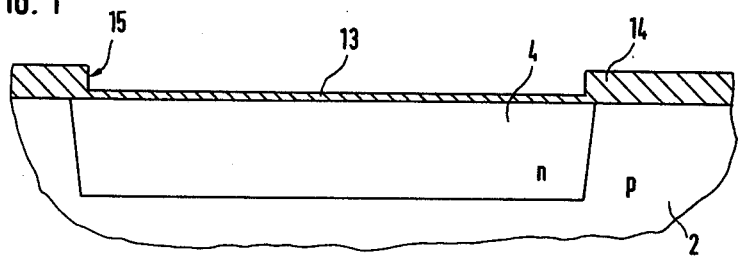
FIGS. 1 to 4 show part of a monolithic integrated circuit in the cross-sectional views approximately perpendicular to a semiconductor wafer, and which serves to explain the sequential steps of the method according to the invention.

The method according to the invention starts from an arrangement as shown in the sectional view of FIG. 1. FIG. 1 shows a p-type semiconductor wafer 2 into which the n-type collector region 4 was diffused in an oxidizing atmosphere using an oxide mask layer 14, with the oxide layer 13 being formed at the surface. The conventional planar diffusion process can be used for this purpose. Since, however, the necessary small amounts of impurities are virtually only controllable by ion implantation, it is preferred to implant the dopant into the semiconductor surface using the oxide mask layer 14 or a photoresist mask, and to activate the dopant in an oxidizing atmosphere during a subsequent diffusion process. The dopant for the collector region 4 may be phosphorous.

It is very advantageous to produce within the openings 15 in the oxide mask layer 14 an oxide layer 13 of such a thickness that the dopant of the base region 3 can be implanted through the same oxide layer 13 as the emitter region 1. This has the advantage of reducing the effects of the variations in the thickness of the oxide layer 13 on the variations in the thickness of the base region 3 below the emitter region 1. If the thickness of the oxide layer 13 ranges between 30 and 60 nm, both boron as the dopant of the base region 3 and arsenic as the dopant of the emitter region 1 can be implanted through the same oxide layer 13.

After the collector region 4 and the oxide layer 13 have been produced, a frame-shaped opening 18 surrounding the collector region 4 can be formed in the oxide mask layer 14. Through this opening 18, the dopants of a guard-ring region 19 (see FIG. 4) are implanted during the implantation of the dopants of the base region 3.

Figure 2:
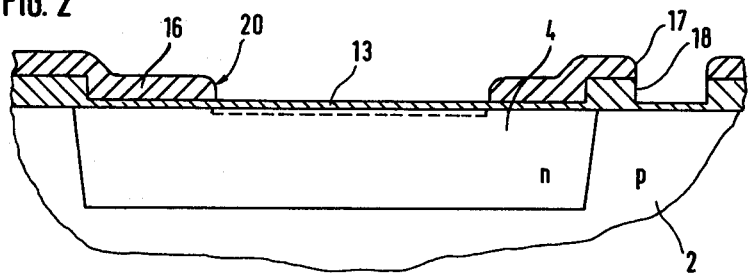
Figure 3:
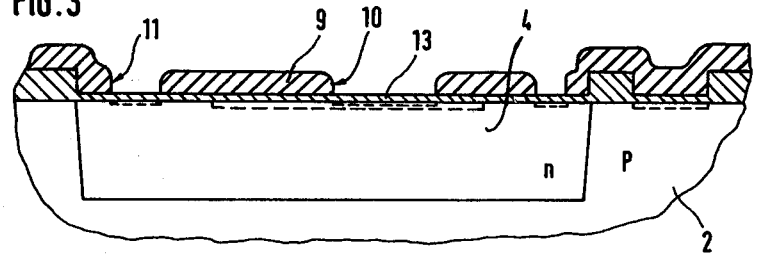

Following the deposition of the mask layer 16, preferably a photoresist layer, with the frame-shaped implantation opening 17 and the base-implantation opening 20, boron ions are implanted (FIG. 2). Then, the mask layer 16 is removed.

Next, the implantation mask 9 is deposited. It has a frame-shaped opening 11, which surrounds the emitter-region-implantation opening 10 and allows the implantation of the dopant of a frame-shaped collector contact region 12 (see FIG. 4). This deposition is followed by the implantation of arsenic ions.

At a thickness of the oxide layer 13 in the above-mentioned range between 30 and 60 nm, accelerating voltages of about 200 KV are necessary for the arsenic atoms. If phosphorous ions are implanted instead of arsenic ions, an accelerating voltage of 100 KV is sufficient, because the phosphorous ion is smaller than the arsenic ion. However, the preferred dopant for the emitter region is arsenic, because it is better accommodated in the Si lattice, so that better electrical properties of the components are obtained.

After careful removal of the implantation mask 9, the surface of the semiconductor wafer 2 is covered with a protective insulating layer 5, preferably of SiO$_2$, and the implanted ions are then activated in a tempering process, during which the base region 3, the emitter region 4, the collector contact region 12, and the guard-ring region 19 are formed; in addition, the protective insulating layer 5 is densified.

Figure 4:
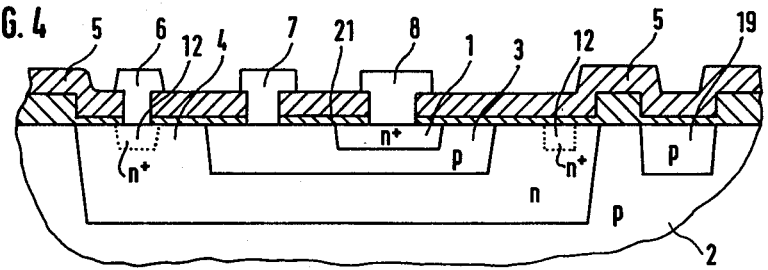

As can be seen in FIG. 4, contact windows are now formed in the protective insulating layer 5, and the contacts 6, 7, and 8 are deposited. An advantage lies in the fact that the edges of the emitter pn junction 21 are protected during the whole high-temperature process and remain protected thereafter, so that emitters for reproducible high emitter efficiencies at comparatively low current densities are obtained.

The cutoff frequency ($f_D$) of an integrated planar transistor fabricated by the method according to the invention and occupying an area of 36 $\mu m^2$ is about 2 GHz, i.e., considerably higher than that of transistors fabricated by the method disclosed in DE-OS No. 30 09 434.

In the process described, only photoresist masks were used to provide a masked area during ion implantation into the base region 3 and the emitter region 1.

I claim:

1. In a method for fabricating an integrated planar transistor from a semiconductor body having a planar surface comprising the initial steps of:
   introducing first impurities for a collector region into said surface by masked ion implantation and a first diffusion of said first impurities in an oxidizing atmosphere,
   the improvement comprising the subsequent steps of:
   sequentially introducing into said surface second impurities of a base region and third impurities of an emitter region by sequential masked ion implantations in an oxidizing atmosphere;
   covering said surface with a protective insulating layer;
   simultaneously diffusing said second impurities in said base region and said third impurities in said emitter region by application of heat;
   forming openings in said protective insulating layer in predetermined locations; and
   depositing contacts in said openings.

2. A method in accordance with claim 1, wherein during said diffusing steps said protective layer is densified.

3. A method in accordance with claim 1, wherein said first diffusion is performed in such a slightly oxidizing atmosphere as to produce an oxide layer through which said second and third impurities may subsequentially be implanted.

4. A method in accordance with claims 1 or 3 wherein said third impurity is implanted through openings of an implantation mark, said openings including an emitter region implantation opening and a frame shaped opening surrounding said emitter region implantation opening defining a frame shaped collector contact region.

5. A method in accordance with claim 1, wherein during said sequential masked ion implantation photoresist masks are used.

6. A method in accordance with claim 2, wherein during said sequential masked ion implantation photoresist masks are used.

7. A method in accordance with claim 3, wherein during said sequential masked ion implantation photoresist masks are used.

8. A method in accordance with claim 4, wherein during said sequential masked ion implantation photoresist masks are used.

9. A method for fabricating an integrated planar transistor from a semiconductor body having a planar surface comprises:
   diffusing a first impurity into a predetermined collector region on said surface;
   depositing a second mask layer on said surface having an opening defining a base region on said surface within said collector region;
   implanting a second impurity into said base region;
   removing said second mask layer;
   depositing a third mask layer on said surface having an opening defining an emitter region on said surface within said base region;
   implanting a third impurity into said emitter region;
   removing said third mask layer; and
   simultaneously diffusing said second impurities in said base region and said third impurities in said emitter region.

10. A method in accordance with claim 9, wherein prior to said simultaneous diffusion step, a protective insulating layer is deposited on said surface.

11. A method in accordance with claim 9, wherein said second impurity implantation step is an ion implantation; and
    said third impurity implantation step is an ion implantation.

12. A method in accordance with claim 9, wherein said first impurity diffusing step comprises:
    depositing a first mask layer on said surface having an opening defining said collector region;
    implanting said first impurity in said collector region; and
    diffusing said first impurities in said collector region by a first application of heat.

13. A method in accordance with claim 9, wherein said second impurity is boron and said third impurity is arsenic.

14. A method in accordance with claim 9, wherein said second mask layer comprises a guard ring opening defining a guard ring region surrounding said collector region;
    during said second impurity implanting step, said second impurity is further implanted in said guard ring region; and
    during said simultaneous diffusing step, said second impurity is diffused in said guard ring region.

15. A method in accordance with claim 9, wherein said third mask layer comprises a collector contact opening defining a collector contact region surrounding said emitter region;
    during said third impurity implanting step, said third impurity is implanted in said collector contact region; and
    during said simultaneous diffusing step said third impurity is diffused in said collector contact region.

16. A method in accordance with claim 12, wherein said simultaneous diffusing step comprises subjecting said semiconductor body to heat.

17. A method in accordance with claim 16, wherein prior to said simultaneous diffusion step a protective insulating layer is deposited on said surface.

18. A method in accordance with claim 13, wherein said first impurity is phophorous.

19. A method in accordance with claim 14, wherein said third mask layer comprises a collector contact opening defining a collector contact region surrounding said emitter region;
   during said third impurity implanting step, said third impurity is implanted in said collector contact region; and
   during said simultaneous diffusing step, said third impurity is diffused in said collector contact system.

* * * * *